United States Patent
Weber et al.

(10) Patent No.: US 6,203,849 B1
(45) Date of Patent: Mar. 20, 2001

(54) PROCESS AND DEVICE FOR COATING DISC-SHAPED DATA STORAGE MEDIA

(75) Inventors: Klaus Weber, Bretten; Martin Kallis, Mühlacker, both of (DE)

(73) Assignee: Steag Hamatech GmbH Machines (DE)

( * ) Notice: Subject to any disclaimer, the term of this patent is extended or adjusted under 35 U.S.C. 154(b) by 0 days.

(21) Appl. No.: 09/180,734
(22) PCT Filed: Mar. 26, 1997
(86) PCT No.: PCT/EP97/01536
  § 371 Date: Nov. 13, 1998
  § 102(e) Date: Nov. 13, 1998
(87) PCT Pub. No.: WO97/43051
  PCT Pub. Date: Nov. 20, 1997

(30) Foreign Application Priority Data

May 15, 1996 (DE) ............................................... 196 19 678

(51) Int. Cl.⁷ ..................................................... B05D 3/12
(52) U.S. Cl. .......................... 427/240; 427/162; 427/425; 118/52; 118/320
(58) Field of Search ................................. 427/162, 240, 427/425; 118/52, 320, 503

(56) References Cited

U.S. PATENT DOCUMENTS

| 4,267,212 | * | 5/1981 | Sakawaki ............................. 427/240 |
| 4,353,937 | | 10/1982 | Chiba et al. . |
| 4,451,507 | | 5/1984 | Beltz et al. . |
| 4,807,356 | | 2/1989 | Maruyama et al. . |
| 4,837,757 | | 6/1989 | Okada et al. . |
| 5,989,632 | * | 11/1999 | Sanada et al. ....................... 427/240 |

FOREIGN PATENT DOCUMENTS

| 3626029 | 2/1987 | (DE) . |
| 0489328 | 6/1992 | (EP) . |
| 0618504 | 10/1994 | (EP) . |
| 0677334 | 10/1995 | (EP) . |

* cited by examiner

Primary Examiner—Shrive Beck
Assistant Examiner—Jennifer Calcagni
(74) Attorney, Agent, or Firm—Robert W. Becker & Associates

(57) ABSTRACT

In a method for coating of disc-shaped data storage media with a coating medium at least one coating nozzle is moved quickly by a first movement into the vicinity of a coating medium application location at the inner area of a storage medium and subsequently the at least one application nozzle is moved slowly by a second movement to the location of application. The coating medium is applied at the location of application and is distributed by a centrifugal force resulting from rotation of the storage medium. The device for coating disc-shaped data storage media with a coating medium has a rotatable support for the storage medium and at least one coating nozzle comprising a drive unit for moving the at least one coating nozzle across the storage medium to a location of application of the coating medium. The drive unit is a hydraulic arrangement with a first hydraulic cylinder for a first, fast movement and a second hydraulic cylinder for a second, slow movement of the at least one coating nozzle.

10 Claims, 2 Drawing Sheets

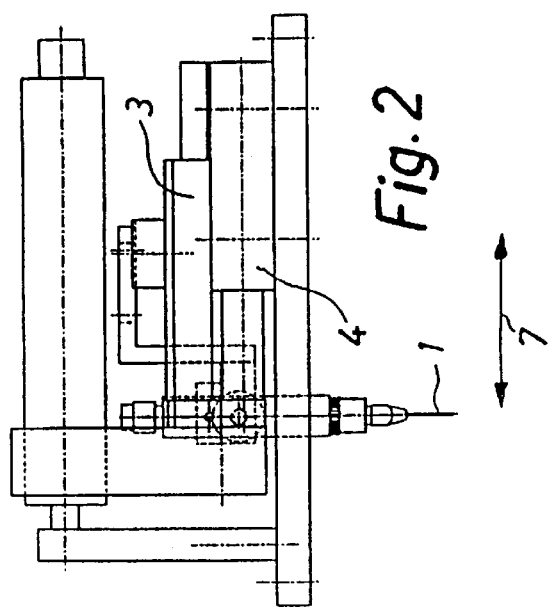
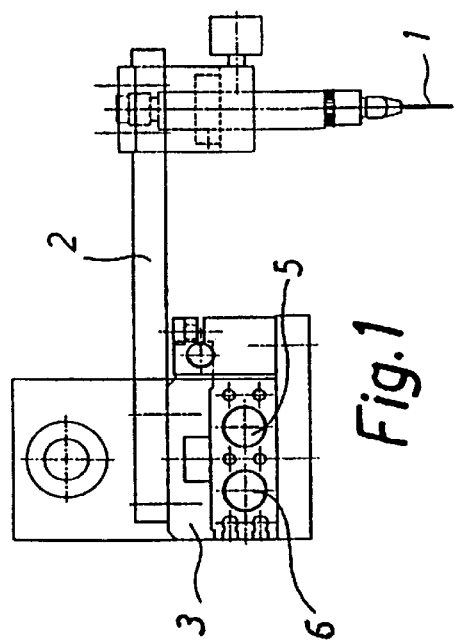
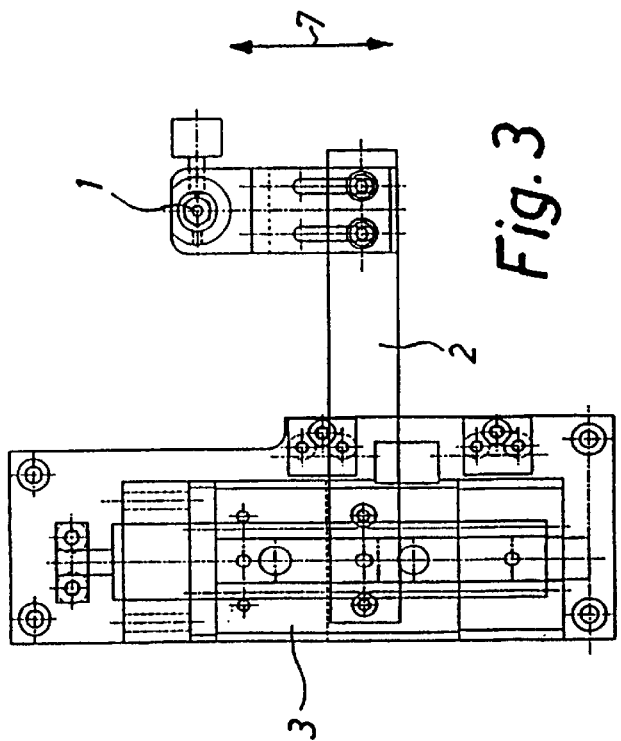

PROCESS AND DEVICE FOR COATING DISC-SHAPED DATA STORAGE MEDIA

BACKGROUND OF THE INVENTION

The invention relates to a method for coating data storage media with a coating medium that is applied by at least one coating nozzle in the inner area of the storage medium and is distributed thereon by rotation of the storage medium due to the resulting centrifugal force. The invention relates furthermore to a device for performing the aforementioned method.

Disc-shaped data storage media are, for example, compact discs (CDs), mini discs, magneto-optical discs, CD-ROMs, CD-Rs, photo and/or video discs. In the following, such discs are referred to as disc-shaped data storage media or, for short, storage media.

Devices of the aforementioned kind are produced and distributed by the assignee of this patent. FIG. 5 shows a schematic representation of the device, respectively, of the sequence of the coating and drying process at the respective stations of this device.

At a supply station 1 the disc-shaped data storage media 2 are received by a manipulation device 3, in the shown case a so-called process cup gripper, comprising gripper arms 4,5 facing the supply station 1 which grip the storage media 2 supplied by the supply station 1 and transport them to the coating stations 6,7 of a processing unit 8. After coating of the storage media 2 with a coating medium, for example, a coating lacquer, the storage media 2 are transported by the gripper arms 10,11 facing the drying station 9 to a receiving position 12 from where they are transported into a drying chamber 13. After the drying process, the storage medium 2 is transported from the drying chamber 13 into a position 14 within the drying station in which a further gripper 15 grips it and transports it into the receiving station 16.

The afore disclosed coating devices for disc-shaped data storage media have been used successfully in the production of such storage media.

It is an object of the invention to improve coating processes and devices for disc-shaped information storage media and to provide devices which, per time unit, allow more coating steps, which are more reliable and need less downtime, and which provide for a reduced manufacturing and service expenditure, especially for the coating stations.

SUMMARY OF THE INVENTION

Based on the aforementioned method this object is inventively solved in that at least one coating nozzle in a first movement step is moved fast into the vicinity of the coating medium application location and in a second movement is slowly positioned at the application location. With the first fast movement the coating nozzle is moved in a short period of time into the vicinity of the coating medium application location in order to keep the application process as short as possible and to increase the productivity of the method. With a fast movement, however, at least in context with hydraulic drive devices, it is not possible or possible only with great expenditure to position the coating nozzle exactly at the location at which the coating medium is to be applied within the inner area of the storage medium. When the coating nozzle, on the one hand, is not brought far enough into the inner area toward the selected optimal application location, an undesirable area of the storage medium remains uncoated. When the coating nozzle is moved past the optimal location of application radially inwardly, an undesirable coating of the inner edge of the cutout portion of the storage medium within the inner area or of an inner annular portion of the storage medium which is used for manipulating the storage medium occurs. This holds especially true for modern, state-of-the -art CDs which, in contrast to the conventional CDs, have a cutout of only 15 mm diameter instead of an inner cutout of 35 mm. Furthermore, CDs have an annular groove in the inner area which forms at the opposite side of the storage medium an annular projection. When the coating nozzle is moved by the first fast movement to this annular groove or to the annular projection, the coating medium is applied to the groove or projection which is not desirable. During the subsequent spinning process, this results in a non-uniform distribution on the surface of the storage medium and results in strips and non-uniform thickness of the coating across the surface of the storage medium. These disadvantages are avoided with the inventive feature of the present invention in that a second movement is provided which moves the coating nozzle, after the first fast movement, slowly to the location of application.

Preferably, the velocity with which the coating nozzle is moved during the first and/or second movement can be adjusted according to the respective specifications. Thus, it is possible to individually adjust the movement velocities of the first and second movements to the respective process steps, different storage media and/or coating media.

According to a further very advantageous embodiment, the first fast movement is carried out with the storage medium being stationary, while during the second slow movement the storage medium is moved so that, when the coating nozzle is positioned at the selected location of application, the coating medium can be applied immediately and spun across the storage medium. In this manner it is possible to further shorten the coating process.

Based on a device for coating of disc-shaped data storage media with a coating medium, comprising of rotatable support for the storage medium and at least one coating nozzle, which comprises a drive unit for moving the coating nozzle across the storage medium to the location of application of the coating medium, the aforementioned object is solved in that the drive unit is a hydraulic arrangement with a first hydraulic cylinder for a first fast movement and a second hydraulic cylinder for a second slow movement of the coating nozzle. The aforementioned advantages mentioned in context with the inventive method also apply to the inventive device.

In general, it is possible to use as the drive unit for moving the coating nozzle a step motor that is controllable with respect to the drive velocity. Step motors for this purpose, however, are more complicated and expensive than hydraulic arrangements so that the latter provide a substantial advantage with respect to economic considerations.

According to an advantageous embodiment of the invention, the second hydraulic cylinder takes over the drive of the coating nozzle after completion of the driving action by the first hydraulic cylinder. Especially advantageous is an embodiment according to which the second hydraulic cylinder acts counter to the first hydraulic cylinder during the second slower movement. The first hydraulic cylinder thus realizes the movement of the coating nozzle up to the application location or to a point shortly before, and the movement is then slowed by the second hydraulic cylinder. The second hydraulic cylinder serves in this embodiment as a braking cylinder for the first hydraulic cylinder.

It is advantageous when the cylinder velocity of the first and/or second hydraulic cylinder is selectable, adjustable, controllable and/or governable. The first and/or second hydraulic cylinder comprises thus advantageously a respectively adjustable fluid throttle.

BRIEF DESCRIPTION OF THE DRAWINGS

The invention will now be described in the following with the aid of a preferred embodiment by referencing the Figures. It is shown in:

FIG. 1 a representation of the inventive device in a first view;

FIG. 2 the device represented in FIG. 1 in a position rotated by 90° relative to the view of FIG. 1;

FIG. 3 the device shown in FIGS. 1 and 2 in a plan view;

DESCRIPTION OF PREFERRED EMBODIMENTS

Figure 4:
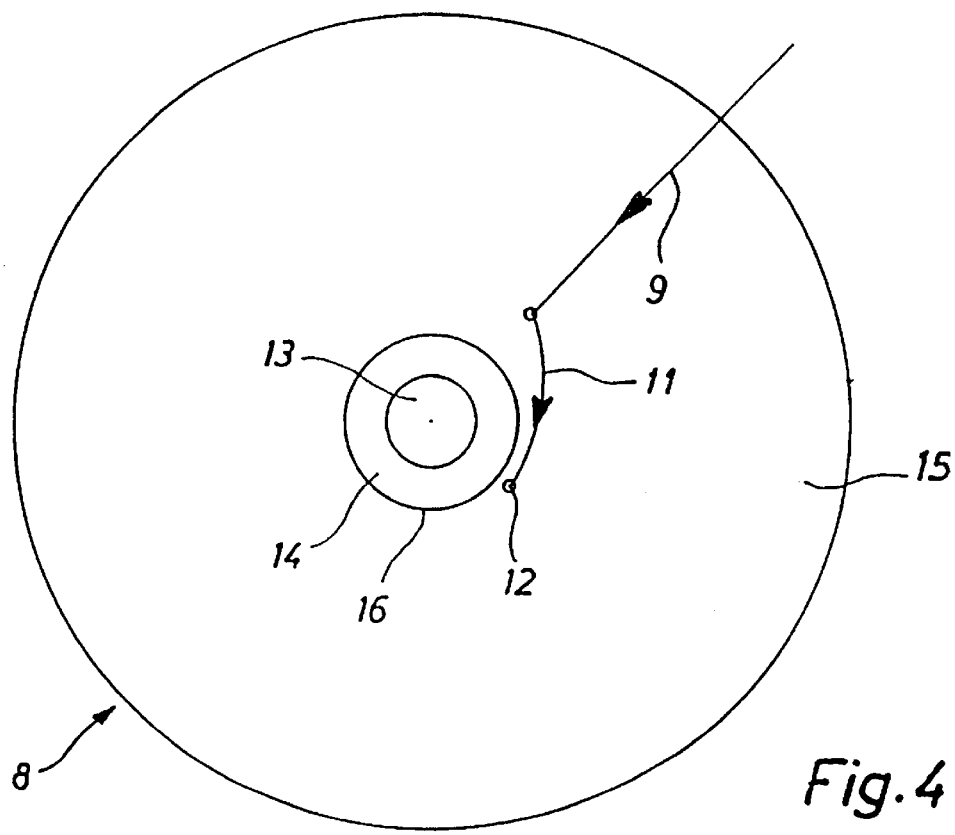
FIG. 4 a schematic representation of the storage medium to be coated in a plan view for illustrating the inventive movements.
Figure 5:
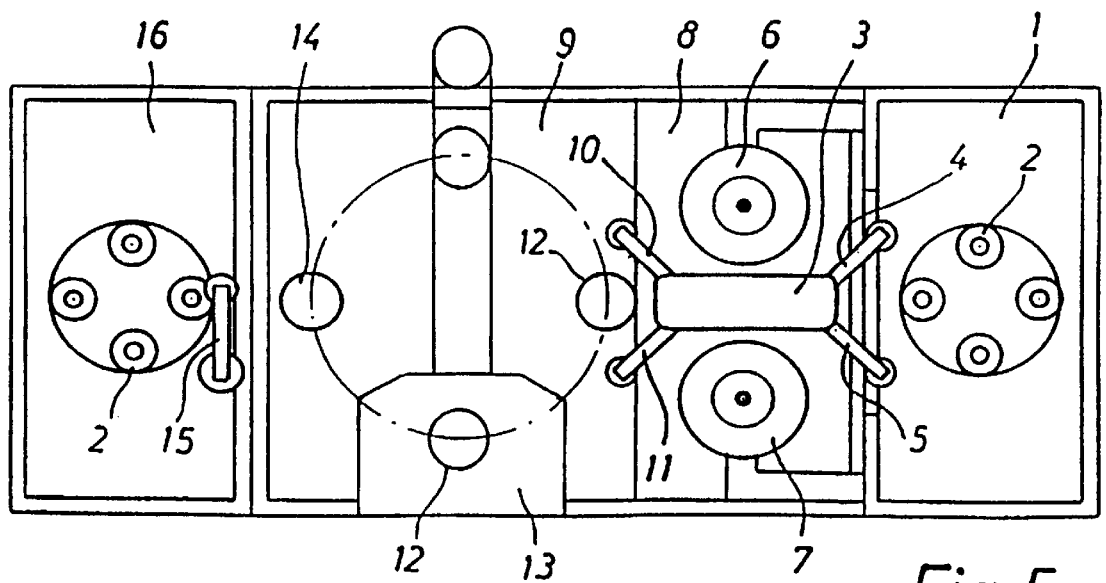
FIG. 5 a schematic representation of the entire coating device.

As shown in FIGS. 1 through 3, the coating nozzle 1 is connected to a support arm 2 which is supported by a carriage 3. The carriage 3 is slidably supported on a carriage guide 4 and is moved relative to the guide 4 by hydraulic cylinders 5,6 in the schematically represented movement direction 7 so that the coating nozzle 1 is moved from the edge of the storage medium 8 to be coated to the location of application 12 (see FIG. 4) at which the coating nozzle 1 is turned on and the coating medium is applied to the storage medium 8.

One of the hydraulic cylinders 5,6 serves as the first hydraulic cylinder 5 or 6 for the fast movement of the coating nozzle 1 across the greater portion of the radial area of the storage medium 8 to a location 10 where the linear radial movement of the coating nozzle 1 is slowed until it reaches the preselected application location 12 above the storage medium 8 where it is stopped. During this last movement the second hydraulic cylinder 6 or 5 acts counter to the first hydraulic cylinder 5 or 6 and thus acts as a braking cylinder.

FIG. 4 shows a schematic representation of the movement of the coating nozzle 1 relative to the storage medium 8. For this purpose, the storage medium 8 to be coated, for example, a CD, is shown in a plan view resting on a non-represented turntable during the coating process. The storage medium 8 is first stationary and the coating nozzle 1 is moved radially in a linear movement 9 toward the center point of the storage medium 8 by being driven by the first hydraulic cylinder 5 or 6 to a location 10 where the braking cylinder 6 or 5 is then operated and the velocity of the first hydraulic cylinder 5 or 6 and thus of the coating nozzle 1 is reduced. In the shown embodiment at the point in time when the coating nozzle 1 is positioned at the location 10, i.e., at the point in time of operating the second hydraulic cylinder 6 or 5, the storage medium 8 is rotated so that the linear movement of the coating nozzle 1 results in a movement 11 relative to the surface of the storage medium 8 toward the coating medium location of application 12 which is very exactly defined because the movement between the location 10 and the location of application 12 is very slow. At the moment when the coating nozzle 1 reaches the location of application 12, the application of the coating medium onto the storage medium 8 can be started immediately because it is already in rotation and the coating medium can be uniformly distributed and spun across the surface of the storage medium.

As shown schematically in FIG. 4, the storage medium 8, which is shown in the form of a CD in this embodiment, has a cutout 13 and an inner annular portion 14 which serves for manipulating the CD and which, relative to the external portion 15 to be coated of the CD 8, is delimited by a circular groove 16, respectively, a circular complementary projection at the other side of the CD 8.

The inventive method, respectively, the inventive device provides for a simple and precise coating of the storage medium 8 with minimal apparatus and servicing expenditure and with a high productivity rate by providing a first, fast movement of the coating nozzle 1 and a subsequent slow, very precise movement toward the location of application 12, whereby, on the one hand, the entire area external to the circular groove 16 is coated reliably, and, on the other hand, it is reliably prevented that the coating medium contaminates this groove 16, respectively, the complimentary projection which would result in stripe formation on the CD. It is also reliably ensured that no coating medium can be applied onto the inner annular portion 14 so that the handling devices will not be contaminated or soiled with a coating medium.

The invention has been explained above with a preferred embodiment. However, a person skilled in the art will be able to conceive numerous developments and embodiments without deviating from the gist of the invention. For example, it is possible to replace the second braking cylinder 6 or 5 which counteracts the first hydraulic cylinder 5 or 6 with a cylinder that takes over the movement of the first hydraulic cylinder approximately at a point in time when the coating nozzle 1 is positioned at the location 10.

The present invention is, of course, in no way restricted to the specific disclosure of the specification and drawings, but also encompasses any modifications within the scope of the appended claims.

What is claimed is:

1. A method for coating disc-shaped data storage media (8) with a coating medium, said method comprising the steps of:
    a) moving (9) at least one coating nozzle (1) at a first speed to a first location (10) in the vicinity of a coating medium application location (12) at the inner area of a storage medium (8) via a first hydraulic cylinder (5 or 6);
    b) subsequently moving (11) the at least one application nozzle (1) at a second speed to the location of application (12), via a second hydraulic cylinder (6 or 5) that acts counter to said first hydraulic cylinder (5 or 6) at said first location (10) to slow the at least one coating nozzle (1) until it reaches the preselected application location (12) above the storage medium (8) where said at least one coating nozzle (1) is stopped, wherein said second speed is less than said first speed;
    c) applying the coating medium at the location of application (12); and
    d) distributing the coating medium by a centrifugal force resulting from rotation of the storage medium (8).

2. A method according to claim 1, wherein the speed of the first hydraulic cylinder (5 or 6) is adjustable.

3. A method according to claim 1, wherein the speed of the second hydraulic cylinder (6 or 5) is adjustable.

4. A method according to claim 1, wherein the speeds of the first and second hydraulic cylinders (5 and 6) are adjustable.

5. A method according to claim 1, wherein in the step b) the storage medium (8) is rotated.

6. A device for coating disc-shaped data storage media (8) with a coating medium, said device comprising:

a rotatable support for the storage medium (8);

at least one coating nozzle (1) comprising a drive unit (5, 6) for moving said at least one coating nozzle (1) across the storage medium (8) to a location of application (12) of the coating medium;

wherein said drive unit (5, 6) is a hydraulic arrangement with a first hydraulic cylinder (5 or 6) for a first movement (9) and a second hydraulic cylinder (6 or 5) for a second movement (11) of said at least one coating nozzle (1), said first hydraulic cylinder (5 or 6) moving the coating nozzle (1) across the storage medium (8) to a first location (10) and said second hydraulic cylinder (6 or 5) acting counter to said first hydraulic cylinder (5 or 6) at said first location (10) to slow the at least one coating nozzle (1) until it reaches the preselected application location (12) above the storage medium (8) where said at least one coating nozzle (1) is stopped; and wherein said first movement (9) is effected at a speed that is greater than a speed of the second movement (11).

7. A device according to claim 6, wherein said second hydraulic cylinder (6 or 5) takes over driving of said at least one coating nozzle (1) after completion of a driving action by said first hydraulic cylinder (5 or 6).

8. A device according to claim 6, wherein said first hydraulic cylinder (5 or 6) comprises an adjustable fluid throttle.

9. A device according to claim 6, wherein said second hydraulic cylinder (5 or 6) comprises an adjustable fluid throttle.

10. A device according to claim 6, wherein said first and said second hydraulic cylinders (5, 6) comprise an adjustable fluid throttle.

* * * * *